July 17, 1962 A. P. COLAIACO 3,045,224

DETECTION CIRCUIT FOR BLOWN FUSES

Filed Oct. 15, 1958

WITNESSES

Leon J. Taza

Myron E. Click

INVENTOR

August P. Colaiaco

BY F. E. Browder

ATTORNEY

United States Patent Office 3,045,224
Patented July 17, 1962

3,045,224

DETECTION CIRCUIT FOR BLOWN FUSES

August P. Colaiaco, Forest Hills, Pa., assignor to Westinghouse Electric Corporation, East Pittsburgh, Pa., a corporation of Pennsylvania Filed Oct. 15, 1958, Ser. No. 767,419
6 Claims. (Cl. 340—250)

This invention relates to detection circuits in general and in particular to detection circuits for series and parallel electrical components. In the application of electrical components, for example, semiconductor rectifiers, one of the serious problems is the detection of the failed electrical components without having to shut down an installation to inspect each individual component. The recent application of semiconductor rectifier diodes in power rectifier installations is an outstanding example of the problems encountered in the detection of failed diodes without having to shut down the entire rectifier installation to inspect each individual diode of a series string of diodes.

The detection of a failed electrical component, whenever a number of electrical components are connected in parallel, is also a serious problem. Using semiconductor rectifier diodes again as an example, a great number of diodes are often connected in parallel in order to obtain the desired current rating.

In a common application, each diode is individually protected by fast, current-limiting fuses. When a diode fails in a parallel diode application, it fails short and blows its respective fuse, leaving the other diodes to carry the current. If too many of the parallel diodes are permitted to fail without being replaced, the remaining diodes are overloaded and will be damaged. Yet, it is desirable not to shut an entire rectifier installation down when only one diode has failed.

Accordingly, it is an object of this invention to provide an improved detection circuit for detecting and indicating the failure of series and parallel electrical components.

It is still another object of this invention to provide an improved detection circuit which indicates the detection of a failed semiconductor rectifier diode in a series and parallel installation, or an individual series installation, or an individual parallel installation.

Further objects of this invention will become apparent from the following description when taken in conjunction with the accompanying drawing. In said drawing, for illustrative purposes, only, there is shown a preferred form of the invention.

Figure 1:
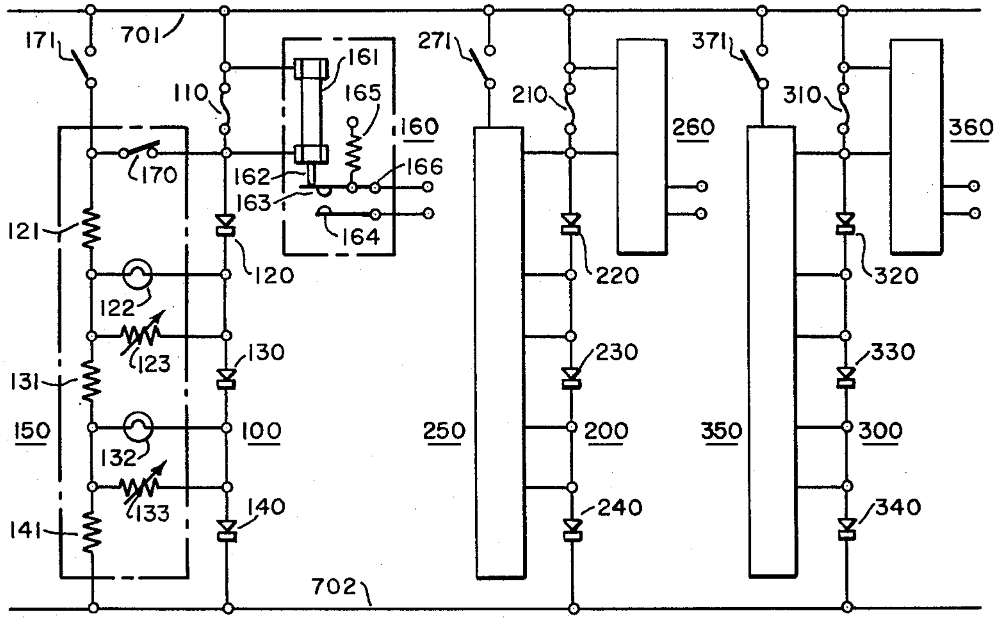
FIG. 1 is a schematic diagram illustrating a rectifier installation having a plurality of series strings of rectifier diodes and a plurality of these strings connected in parallel.

Referring to FIG. 1, there is shown a rectifier installation comprising a plurality of parallel series strings of diodes 100, 200 and 300. The series string 100 comprises rectifier diodes 120, 130 and 140 serially connected with a protective fuse 110 between the direct-current bus conductors 701 and 702. An alternate application may utilize the conductors 701 and 702 as alternating-current bus conductors. The series string 200 comprises rectifier diodes 220, 230 and 240 serially connected with a protective fuse 210 between the direct-current bus conductors 701 and 702. The series string 300 comprises rectifier diodes 320, 330 and 340 serially connected with a protective fuse 310 between the direct-current bus conductors 701 and 702.

An indicating circuit 150 for detecting and indicating the failure of one of the series-connected diodes in the string 100 is associated with the series string 100 as follows. The resistors 121, 131 and 141 are connected in series circuit relationship across the entire string of diodes 120, 130 and 140. The junction of the rectifiers 120 and 130 is connected to the junction of the resistors 121 and 131 by a parallel circuit including an indicating lamp 122 and an adjustable resistor 123. The junction of the rectifier diodes 130 and 140 is connected to the junction of the resistors 131 and 141 by a parallel circuit including an indicating lamp or a visual indicating means 132 and an adjustable resistor 133. That is, each junction of the voltage dividing resistors are connected to a like junction of the series connected electrical components or diodes. Similar circuits 250 and 350 are provided for the series strings 200 and 300, respectively, but are represented only by the block layout, indicated generally at 250 and 350, for the purposes of simplicity.

An indicating circuit for the detection of failed parallel diodes is designated generally at 160 for the series string 100. The parallel indication circuit 160 comprises a trigger fuse 161 having a plunger mechanism 162 connected across the fuse 110 of the series string 100. A pair of normally open contacts 163 and 164 are held normally open by the spring 165 connected to the contact 163 which is pivotally mounted at 166. The contact 163 is disposed with relation to the plunger mechanism 162 so that when the trigger fuse 161 blows the plunger mechanism 162 will be released by the blowing of the trigger fuse 161 so that the contact 163 is closed electrically with the contact 164. Trigger fuses such as denoted at 161 are well known to those skilled in the art and will not be described in detail here. Identical circuits have been provided for the fuses 210 and 310 of the strings 200 and 300 and have been designated generally at 260 and 360. The circuits 260 and 360 have not been shown in detail in the interests of simplicity.

Referring again to the individual failure detection circuit 150, it is seen that the resistors 121, 131 and 141 are used to help divide the inverse voltage applied to the diodes equally over the three diodes 120, 130 and 140. In the prior art, the resistors 121, 131 and 141 have usually been connected across their respective diodes 120, 130 and 140. However, in the indicating circuit 150, the low voltage lamps 122 and 132 and the adjustable resistors 123 and 133 have been inserted to give the series failure indication. The lamps may be of low wattage as compared to the voltage dividing resistors and, therefore, will have a negligible effect upon the voltage division of the resistors 121, 131 and 141.

During normal operation when all three of these series-connected diodes are good, there is a very slight voltage across each of the indicating lamps 122 and 132, and the lamp is not visible. The peak inverse voltage is divided equally across all three diodes with one-third of the peak inverse voltage across each diode. If one of the diodes fails and shorts, say, for example, the rectifier diode 140, then the full peak inverse voltage now appears across the remaining diodes 120 and 130. Thus, the parallel resistance of the lamp 132, resistor 133, and resistor 141 will be in series with the resistances 131 and 121, and the lamp will have a voltage proportional to its resistance. By properly selecting lamps having the correct resistances in comparison with the voltage dividing resistances, then the lamp 132 will glow upon failure of the diode 140.

The resistors 123 and 133 are placed in parallel with the lamps 122 and 132 so that if an individual lamp is burned out the resistors 121, 131 and 141 will still act as voltage dividers. The resistors 123 and 133 may be made adjustable, as shown, to vary the voltage appearing across the lamps 122 and 132 to control their brightness.

The switch 170 shown connecting the resistance 121 to the junction of or a point intermediate of the rectifier diode 120 and the fuse 110, and the switch 171 which may connect the resistance 121 directly to the direct-current bus 701, represent alternate arrangements for connecting the series indicating circuit 150. With the switch 170 closed as is shown in FIG. 1, the circuit operates as hereinbefore described. With the switch 170 open and the switch 171 closed, the resistance 121 is now connected across the fuse 110 also. With the last mentioned arrangement of the switches 170 and 171, if all the diodes 120, 130 and 140 fail and the fuse 110 blows, then the lamp 122 will also indicate the blowing of the fuse 110.

The indicating circuit 150 indicates when all or one of a string of diodes have failed. The circuit arrangement of 150 is inexpensive since only the adjustable resistors and the lamps are added, and these are relatively inexpensive. The lamps are normally operating considerably below their rated voltage so that they will have many years of operating life.

Referring to the indicating circuits 160, 260 and 360, it is recognized that the circuits 160, 260 and 360 may be utilized to indicate the failure of strings of diodes connected in parallel as shown in FIG. 1 or to indicate the failure of a diode whenever a number of single diodes are connected in parallel. The circuit 160 in cooperation with the circuit of FIG. 2 indicates when one of a number of parallel diodes have failed and also will indicate when a predetermined number of a plurality of diodes in parallel have failed.

It will only be necessary to explain the operation of the circuit 160 since the operation of the circuits 260 and 360 are identical thereto. The diode string 100 is protected by a main fuse 110. In parallel with the main fuse 110 is the small trigger fuse 161. When the main fuse 110 blows, the trigger fuse 161 will also blow. The trigger fuse 161 has a spring-loaded plunger mechanism 162 which is released when the fuse 161 blows. This plunger 162 is used to close the contact 163 electrically with the contact 164.

Figure 2:
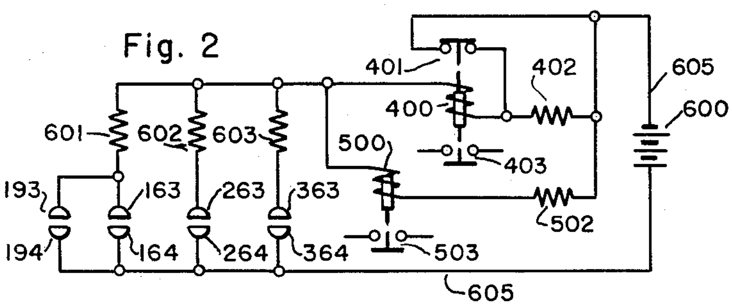
FIG. 2 is a schematic diagram of a selective circuit for the energization of predetermined alarm circuits.

Referring to FIG. 2, there is shown a schematic diagram illustrating how the closing of the contact in one of the indicating circuits 160, 260 and 360 may be utilized to operate an alarm energization circuit and to discriminate between one of said contacts closing thus producing the desired alarm on a single contact closing operation, and also to energize an alarm circuit after a predetermined number of contact closures in the plurality of indicating circuits 160, 260 and 360.

A voltage supply 600, shown as a direct-current source in FIG. 2, supplies voltage on the alarm but 605 for two parallel relays 400 and 500. The relay 400 has a set of forward contacts 403 and a set of back contacts 401. The relay 500 has a single set of contacts 503. The contacts 163, 164 and 263, 264 and 363, 364 of the respective indicating circuits 160, 260 and 360 are connected in series parallel with the relays 400 and 500 so that with all the contacts opened no circuit is formed. In series with the relays 400 and 500 are the resistors 402 and 502, respectively, with the value of the resistance 502 being higher than that of the resistor 402. The relays 400 and 500 are representative of any switching means operable to energize the alarm means discussed hereinafter. For example, switching semiconductors, magnetic amplifiers or electronic tubes may be utilized.

When any of the pairs of contacts of the indicating circuits, for example, the contacts 163, 164 due to a fuse operation in the indicating circuit 160, close, the circuit is completed and the relay 400 operates. The relay 500 does not operate because the resistor 502 limits the current sufficiently to prevent its operation. As an additional feature, whenever relay 400 operates, a back contact 401, connected in parallel with the resistance 402, may open, putting the resistor 402 in series with the relay 400. The relay 400 may be a direct current relay which will remain closed, even though the current therethrough is reduced to 30% of its normal value. Such relays are well known to those skilled in the art and are commercially available. The use of the resistor 402 reduces the wattage rating required for the relay 400, and the resistors 601, 602 and 603 connected in series with each set of contacts.

After a predetermined number of a plurality of contacts connected in parallel, as shown in FIG. 2, are closed, the overall resistance of the circuit of FIG. 2 is reduced because a predetermined number of the resistors 601, 602 and 603 are now placed in parallel. Therefore, more current is allowed to flow through the relay 500, and after a predetermined number of contacts, as hereinbefore described, close, the current through the relay 500 reaches a point where it operates and indicates that a predetermined number of parallel semiconductor rectifier diodes or series strings of diodes, as shown in FIG. 1, have failed.

Figure 4:
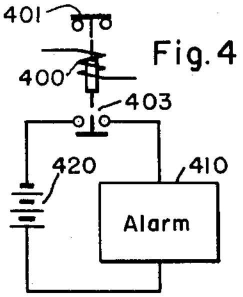
FIG. 4 is a schematic diagram of an alarm circuit to be utilized with the apparatus of FIG. 1.
Figure 5:
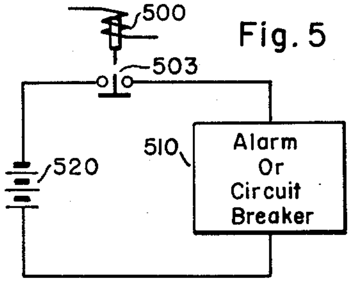
FIG. 5 is a schematic diagram of an alarm circuit to be utilized with the apparatus of FIG. 1.

Referring to FIGS. 4 and 5, there is illustrated schematically how contacts 403 and 503 may be connected in circuit relationship with the voltages 420 and 520 to operate the desired alarms 410 and 510 whenever the relays 400 and 500, respectively, are operated by the proper current flow therethrough. The alarm 410 may be a buzzer, an indicating light or other desired type of alarm. The alarm 510 may be a buzzer, an indicating light, or it may be connected to the circuit breaker for the entire rectifier installation to disconnect the rectifier installation through operation of the main breaker.

Figure 3:
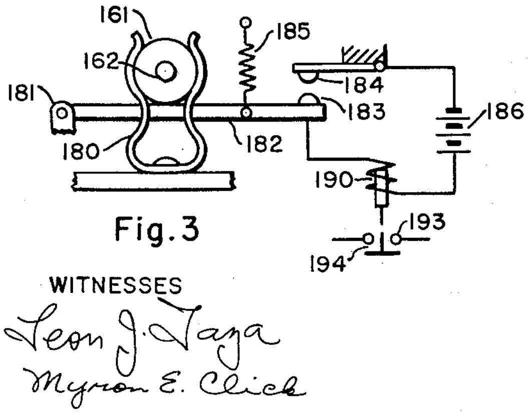
FIG. 3 is an illustration of a fuse holding device and associated electrical circuitry which may be utilized in the apparatus of FIG. 1.

It is apparent that if the trigger fuses, such as 161, of the indicating circuit 160 are not in place, the indicator scheme 160 is inoperative. FIG. 3 shows an arrangement whereby the trigger fuse 161 must be inserted into a fuse clip or holder 180 in order to have proper operation of the indicating circuit 160. The fuse clip 180 is disposed with respect to the contact bar 182 which is pivotally mounted at 181 so that if a trigger fuse 161 is not in place a spring 185 will close the normally opened contacts 184 and 183. A voltage source 186 is serially connected with the contacts 183 and 184 and a relay 190. The contacts 193 and 194 of the relay 190 are shown connected in parallel with the contacts 163 and 164 of the indicating circuits 160 in FIG. 2. Thus, if the trigger fuse 161 is not inserted into the clip, the contacts 183 and 184 are connected operating the relay 190 to close the relay contacts 193 and 194. Thus, the contacts 193 and 194 would be closed causing an operation of the relay 400 and thus an operation of the alarm 410, indicating that the trigger fuse 161 is not in place. The contact assembly 190 may be a microswitch. Similar arrangements for the indicating circuits 260 and 360 may be provided to short-circuit the contacts 263, 264 and 363, 364, providing an alarm until all of the trigger fuses of the respective indicating circuits 160, 260 and 360 are in place.

A second scheme to provide indication that a trigger fuse is not in position would be to eliminate the relay 190 and the voltage source 186 and connect the contacts 183 and 184 directly in parallel with the contacts 163 and 164. Again, if the trigger fuse 161 is not in place, the relay 400 will operate.

Since the indicating circuits 160, 260 and 360 are independent of the voltage of the main rectifier, they may be made as standard packaged products applicable to any rectifier rating.

In conclusion, it is pointed out that while the illustrated examples constitute practical embodiments of my invention, I do not limit myself to the exact details shown, since modification of the same may be effected without departing from the spirit and scope of this invention.

I claim as my invention:

1. A detection circuit comprising; a plurality of paralleled series strings of electrical components, each said series string including a plurality of said electrical components connected in series with a protective fuse; a series failure indicating circuit comprising voltage dividing resistors, one for each of said electrical components, connected in series; each junction of said series connected resistors being connected through a visual indicating means to a like junction of said series connected electrical components; said visual indicating means indicating when a single one of said electrical components has failed; a parallel failure indicating circuit for each of said plurality of paralleled series strings including a trigger fuse connected across said protective fuse; each said trigger fuse operating to close an associated pair of contacts in response to the blowing of said trigger fuse; said pairs of contacts being connected in circuit relationship with an alarm energization circuit.

2. A detection circuit comprising; a plurality of paralleled series strings of electrical components; each said series string including a plurality of said electrical components connected in series with a protective fuse; a series failure indicating circuit comprising voltage dividing resistors, one for each of said electrical components, connected in series; each junction of said series connected resistors being connected through a visual indicating means to a like junction of said series connected electrical components; said visual indicating means indicating when a single one of said electrical components has failed; a parallel failure indicating circuit for each of said plurality of paralleled series strings including a trigger fuse connected across said protective fuse; each said trigger fuse operating to close an associated pair of contacts in response to the blowing of said trigger fuse; said pairs of contacts being connected in circuit relationship with an alarm energization circuit; said alarm energization circuit including a voltage source connected to energize an alarm bus through said pairs of contacts connected in parallel.

3. A detection circuit comprising; a plurality of paralleled series strings of electrical components; each said series string including a plurality of said electrical components connected in series with a protective fuse; a series failure indicating circuit comprising voltage dividing resistors, one for each of said electrical components, connected in series; each junction of said series connected resistors being connected through a visual indicating means to a like junction of said series connected electrical components; said visual indicating means indicating when a single one of said electrical components has failed; a parallel failure indicating circuit for each of said plurality of paralleled series strings including a trigger fuse connected across said protective fuse; each said trigger fuse operating to close an associated pair of contacts in response to the blowing of said trigger fuse; said pairs of contacts being connected in circuit relationship with an alarm energization circuit; said energization circuit including a voltage source connected to energize an alarm bus through said pairs of contacts connected in parallel; switching means responsive to current flow in said alarm bus.

4. A detection circuit comprising; a plurality of paralleled series strings of electrical components; each said series string including a plurality of said electrical components connected in series with a protective fuse; a series failure indicating circuit comprising voltage dividing resistors, one for each of said electrical components, connected in series; each junction of said series connected resistors being connected through a visual indicating means to a like junction of said series connected electrical components; said visual indicating means indicating when a single one of said electrical components has failed; a parallel failure indicating circuit for each of said plurality of paralleled series strings including a trigger fuse connected across said protective fuse; each said trigger fuse operating to close an associated pair of contacts in response to the blowing of said trigger fuse; said pairs of contacts being connected in circuit relationship with an alarm energization circuit; said alarm energization circuit including a voltage source connected to energize an alarm bus through said pairs of contacts connected in parallel; first switching means responsive to current flow in said alarm bus caused by the closing of one of said pairs of contacts; second switching means responsive to current flow in said alarm bus caused by the closing of a predetermined number of said pairs of contacts.

5. A detection circuit comprising; a plurality of paralleled series strings of electrical components; each said series string including a plurality of said electrical components connected in series with a protective fuse; a series failure indicating circuit comprising voltage dividing resistors, one for each of said electrical components, connected in series; each junction of said series connected resistors being connected through a visual indicating means to a like junction of said series connected electrical components; said visual indicating means indicating when a single one of said electrical components has failed; a parellel failure indicating circuit for each of said plurality of paralleled series strings including a trigger fuse connected across said protective fuse; each said trigger fuse operating to close an associated pair of contacts in response to the blowing of said trigger fuse; said pairs of contacts being connected in circuit relationship with an alarm energization circuit; trigger fuse position indicating apparatus including a trigger fuse holding means, normally closed contact means disposed with relation to said fuse holder to be opened by the insertion of said trigger fuse into said holder, and circuit means for energizing an alarm connected to said contacts.

6. A detection circuit comprising; a plurality of electrical components connected in parallel; each said electrical component being connected in series with a protective fuse; a trigger fuse connected in parallel with each said protective fuse; each said trigger fuse operating to close an associated pair of contacts in response to the blowing of said trigger fuse; said pairs of contacts being connected in parallel through individual current limiting means; means connecting a voltage source to energize an alarm bus through said pairs of parallel contacts; first switching means responsive to current flow in said alarm bus caused by the closing of one of said pairs of contacts; second switching means responsive to current flow in said alarm bus caused by the closing of a predetermined number of said pairs of parallel contacts.

References Cited in the file of this patent

UNITED STATES PATENTS

| | | |
|---|---|---|
| 413,735 | Schaefer | Oct. 29, 1889 |
| 1,224,172 | Jackson | May 1, 1917 |
| 2,071,911 | Young | Feb. 23, 1937 |
| 2,159,751 | Saul | May 23, 1939 |
| 2,282,396 | Cravath | May 12, 1942 |
| 2,317,030 | Colvin | Apr. 20, 1943 |
| 2,807,771 | Winograd | Sept. 24, 1957 |
| 2,813,243 | Christian et al. | Nov. 12, 1957 |
| 2,930,961 | Lezan | Mar. 29, 1960 |